United States Patent
Hillman

(10) Patent No.: US 7,673,186 B2
(45) Date of Patent: Mar. 2, 2010

(54) APPARATUS AND METHOD FOR COLD SPARING IN MULTI-BOARD COMPUTER SYSTEMS

(75) Inventor: Robert Allen Hillman, San Diego, CA (US)

(73) Assignee: Maxwell Technologies, Inc., San Diego, CA (US)

( * ) Notice: Subject to any disclaimer, the term of this patent is extended or adjusted under 35 U.S.C. 154(b) by 672 days.

(21) Appl. No.: 11/449,510

(22) Filed: Jun. 7, 2006

(65) Prior Publication Data

US 2007/0285851 A1  Dec. 13, 2007

(51) Int. Cl.
*G06F 11/00* (2006.01)
(52) U.S. Cl. .......................... 714/44; 714/13
(58) Field of Classification Search ............ 714/3, 714/5, 7, 11–13, 24, 44; 710/13, 36; 713/324
See application file for complete search history.

(56) References Cited

U.S. PATENT DOCUMENTS

| | | | | |
|---|---|---|---|---|
| 5,911,050 A | * | 6/1999 | Egan et al. | 710/100 |
| 6,510,529 B1 | * | 1/2003 | Alexander et al. | 714/11 |
| 6,957,353 B2 | * | 10/2005 | Bresniker et al. | 713/320 |
| 7,098,686 B2 | * | 8/2006 | Kong et al. | 326/38 |
| 7,103,697 B2 | * | 9/2006 | Scordalakes | 710/302 |

* cited by examiner

*Primary Examiner*—Dieu-Minh Le
(74) *Attorney, Agent, or Firm*—Oppendahl Patent Law Firm LLC

(57) ABSTRACT

Power supply voltage of a PCI or a similar communication bus interface is separated from one or more other power supply voltages on a backplane, on boards insertable into the backplane, and on the bus interface components of the boards. The power supply of the bus interface (VIO) is provided to cold spare boards inserted into the backplane, while the other voltages are not provided to the cold spare boards. Availability of the VIO on the cold spare boards prevents the VIO clamping diodes on the PCI I/O lines from grounding the PCI bus. Cold spare capability is thus provided to systems with PCI and similar communication buses.

34 Claims, 6 Drawing Sheets

APPARATUS AND METHOD FOR COLD SPARING IN MULTI-BOARD COMPUTER SYSTEMS

FIELD OF THE INVENTION

The present invention relates generally to computer systems. More specifically, the present invention relates to methods and apparatus for providing cold sparing capability to computer systems with multiple boards in a common chassis/backplane.

BACKGROUND

Complex computer systems are often designed using multiple boards pluggable into a backplane. A backplane is generally understood to be a common circuit board for receiving multiple cards/boards pluggable into it. A backplane typically carries to the other boards plugged into it power distribution lines and bus signals for inter-board communication. A backplane is usually made as a printed circuit board with several connectors electrically in parallel with each other, so that at least some pins of at least some of the connectors are coupled together, i.e., a pin on one of the connectors is coupled to the same relative pin of other connector(s). A bus is thus formed.

One of the benefits of backplane-based computer system design is the capability to provide spare boards that can be activated to take over when their corresponding primary (main) boards fail. A fault-tolerant system results when spare boards are plugged into a backplane and a mechanism is included for determining when a board fails and should be replaced with a spare. Fault tolerance is desirable in many applications, for example, in high-reliability military and space environments.

When a spare board is powered, it consumes electrical power and generates heat, without producing any immediate benefit. Therefore, it may be desirable to keep spare boards in the unpowered or "cold" state. When a corresponding primary board fails, the spare board in the cold state may be powered to assume the failed board's functions. Until such time, however, the spare board consumes no (or less) energy, and generates no (or less) heat. Such arrangement is referred to as "cold sparing."

The peripheral component interconnect bus and its metric counterpart, the Compact Peripheral Component Interconnect (cPCI) bus, are widely used for data interchange between various system components, including boards in multi-board systems. (These buses will be collectively referred to as PCI buses in this document.) For some configurations, particularly those including PCI devices designed for 3.3 Volt operation, the PCI standards specify clamping diodes on input/output (I/O) lines. One clamping diode is inserted between the ground or negative supply rail and an I/O line, to prevent the voltage on the I/O line from swinging much below ground potential. A second clamping diode is inserted between the I/O line and VIO (the I/O voltage or positive I/O supply rail), to prevent excessive voltage overshoots. This is illustrated in FIG. 1, in which a diode 110 clamps to ground the voltage on an I/O line 105 of a bus 101, and a diode 115 clamps the I/O line 105 to the VIO. The clamping diodes 110 and 115 thus protect the input of a buffer 120 from under- and over-voltages that may occur on the I/O line 105, for example, resulting from signal overshoot and/or undershoot.

In FIG. 1, the buffer 120 is an input buffer, but a similar arrangement may be employed for output buffers, where the input and output of the buffer are reversed. A similar arrangement may also be employed for bi-directional buffers.

The ground clamping diode 110 is generally needed for current PCI devices, regardless of their voltage range. The VIO clamping diode 115, however, is generally needed for PCI devices designed for 3.3 volt operation, but it may be unnecessary for devices designed for 5 volt operation. This is a consequence of the smaller geometries in the lower-voltage rated devices, which make such devices more susceptible to damage from exposure to higher voltages.

The conventional cold sparing approach is to power off the entire chip or board, so that the I/O lines of the chip or board are tristated. This approach is incompatible with PCI buses that require VIO clamping diodes (e.g., the diode 115), because the VIO clamping diode effectively clamps its corresponding communication line (e.g., the I/O line 105) to ground potential when the VIO power supply line is at ground potential. It should be noted that the VIO clamping diode affects not only the particular device that it protects, but all other devices having PCI I/O lines connected in parallel with the corresponding I/O lines of the protected device, because it effectively shunts to ground all the corresponding lines of the PCI bus to which the protected device is connected, precluding exchange of data over the PCI bus and possibly increasing power consumption.

It would be desirable to allow the use of PCI and similar devices and buses in cold sparing configurations, and to do so without sacrificing the over-voltage protection afforded by the VIO clamping diodes.

SUMMARY

A need thus exists for methods of providing cold sparing capability to buses and devices with VIO clamping diodes. Another need exists for backplanes with buses, such as PCI buses, that can be used in cold sparing configurations. These needs may be met with a configuration in which the VIO voltage of a PCI or a similar bus of a cold spare board stays on while the rest of the cold spare board is powered off.

In an embodiment, a method of providing power to a first board of a multi-board digital system includes preventing at least one first operating voltage for powering the first board from reaching the first board, thereby causing the first board to be in a spare board state. The method further includes providing I/O voltage (VIO) power to a communication interface of the first board so that one or more clamping diodes between one or more lines of the communication interface and a rail that provides the VIO power to the communication interface of the first board do not clamp the one or more lines to ground when the first board is in the spare board state.

In aspects of the invention, the communication interface is a PCI bus or a cPCI bus.

In aspects of the invention, the method also includes preventing at least one second operating voltage for powering the first board from reaching the first board when the first board is in the spare board state.

In aspects of the invention, the method also includes monitoring a second board of the multi-board digital system to detect a failure of the second board. When the failure of the second board is detected, the step of preventing at least one first operating voltage from reaching the first board is terminated, and the first board receives the first operating voltage, becoming a primary (non-spare) board. In this state, the first board is powered by both the VIO voltage and the first operating voltage.

In aspects of the invention, the failure of the second board is detected by sensing expiration of a watchdog timer or detecting an uncorrectable error. The watchdog timer may be located on the system's backplane, on one of the boards, or elsewhere within the multi-board digital system.

In aspects of the invention, the step of monitoring includes using a board selector module located on the backplane of the multi-board digital system.

In aspects of the invention, preventing at least one first operating voltage from reaching the first board is performed by maintaining a switch in a non-conducting state. When the step of preventing at least one first operating voltage from reaching the first board is terminated, the switch is turned to a conducting state. The switch may be a solid state switch, a normally-open relay, or a normally-closed relay. The switch may be located on the backplane of the multi-board digital system.

In aspects of the invention, the method also includes preventing the at least one first operating voltage from reaching the second board in response to detection of the failure in the second board. The second board may be reset and given another chance to initialize. If the failure disappears, the second board may be treated as a spare board.

In aspects of the invention, the step of preventing at least one first operating voltage from reaching the second board is performed by changing state of a second switch located on the backplane.

In aspects of the invention, the step of preventing at least one first operating voltage from reaching the first board is performed by maintaining a first switch located on the first board in an open state. When the step of preventing at least one first operating voltage is terminated, the first switch is turned to a closed state.

In aspects of the invention, when the failure in the second board is detected, the state of a second switch located on the second board is changed to prevent the at least one first operating voltage from reaching components of the second board.

In an embodiment, a multi-board digital system includes one or more lines of an inter-board communication bus, a first board, a second board, a first cold sparing controller associated with the first board, and a VIO power bus. The first and the second boards are configured to perform substantially the same functions, so that the first board is a spare board, and the second board is a primary board. The first board includes a first inter-board communication interface to the one or more lines of the inter-board communication bus. The first communication interface has a first voltage I/O (VIO) rail (such as the VIO connection at the cathode of the diode 115 in FIG. 1). The first cold sparing controller is configured to (1) provide to the first board at least one operating voltage in a first (conducting) state, and (2) isolate the first board from the at least one operating voltage in a second (non-conducting) state. The VIO power bus is configured to provide an I/O voltage (VIO) power to the first VIO rail when the first cold sparing controller is in the first state and also when the first cold sparing controller is in the second state.

In an embodiment, a backplane of a digital system includes a first board socket configured to receive a first board, a second board socket configured to receive a second board, one or more lines of an inter-board communication bus coupled to the first board socket and to the second board socket, means for selectively providing at least one operating voltage, and means for supplying an input-output voltage (VIO). The means for selectively providing is configured to provide at least one operating voltage to the first and second boards through the first and second board sockets. The means for selectively providing is further configured to (1) provide at least one operating voltage to the first board when the means for selectively providing is in a first state, (2) provide at least one operating voltage to the second board when the means for selectively providing is in a second state, (3) isolate at least one operating voltage from the first board when the means for selectively providing is in the second state, and (4) isolate the at least one operating voltage from the second board when the means for selectively providing is in the first state. The means for supplying an input-output voltage (VIO) is configured to provide the VIO to a first inter-board communication interface of the first board through the first socket and to a second inter-board communication interface of the second board through the second socket when the means for selectively providing is in the first state and also when the means for selectively providing is in the second state.

These and other features and aspects of the present invention will be better understood with reference to the following description, drawings, and appended claims.

DETAILED DESCRIPTION

Figure 1:
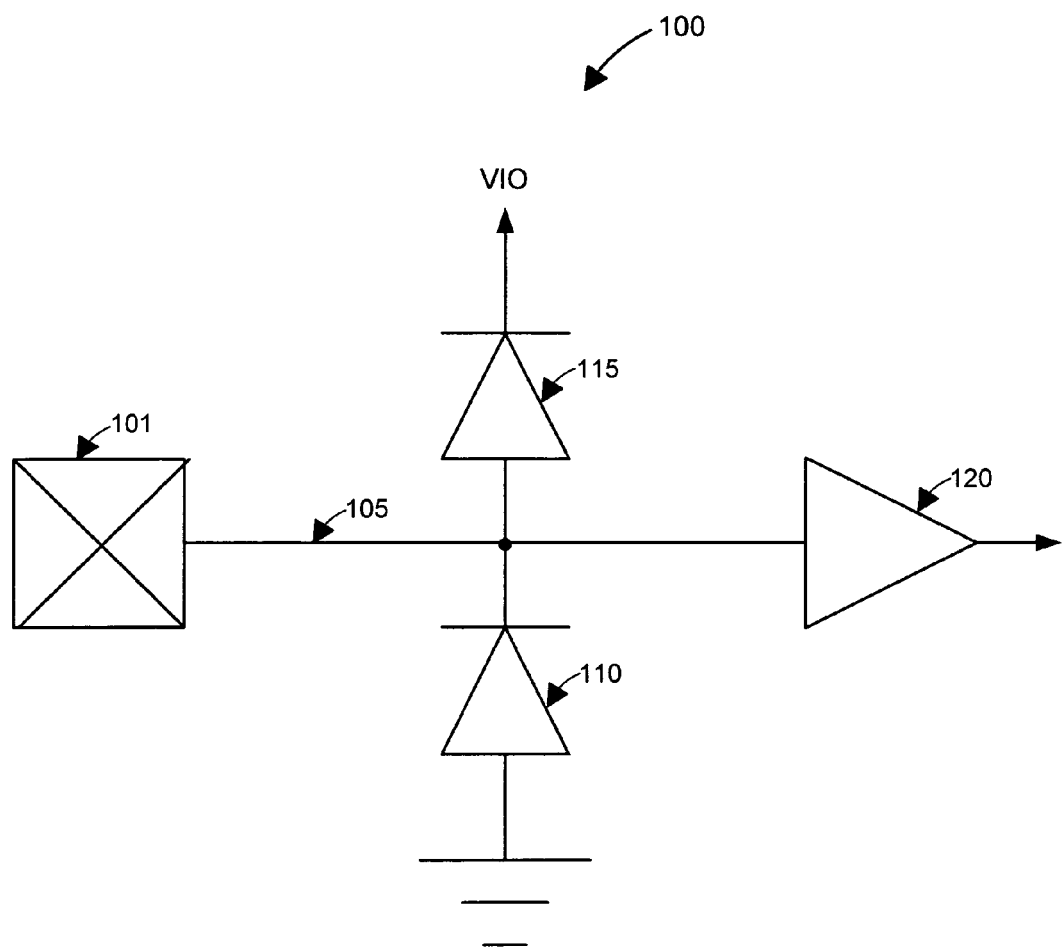
FIG. 1 shows selected components of a PCI bus interface with clamping diodes.

In this document, the words "embodiment" and "variant" refer to particular apparatus, process, or article of manufacture, and not necessarily to the same apparatus, process, or article of manufacture. Thus, "one embodiment" (or a similar expression) used in one place or context can refer to a particular apparatus, process, or article of manufacture; the same or a similar expression in a different place can refer to a different apparatus, process, or article of manufacture. The expression "alternative embodiment" and similar phrases are used to indicate one of a number of different possible embodiments. The number of possible embodiments is not necessarily limited to two or any other quantity. Characterization of an embodiment as "exemplary" means that the embodiment is used as an example. Such characterization does not necessarily mean that the embodiment is a preferred embodiment; the embodiment may but need not be a currently preferred embodiment.

The words "couple," "connect," "link," and similar expressions with their inflectional morphemes do not necessarily import an immediate or direct connection, but include connections through mediate elements within their meaning.

The word "backplane" signifies an electronic circuit board into which additional electronic devices on other circuit boards or cards can be plugged or connected. The additional boards or cards are generally inserted into connectors or sockets, but they may also be hardwired to the backplane. A backplane may include electronic circuitry. In a computer, a backplane may be synonymous with a motherboard.

The expression "clamp substantially to ground potential" and similar phrases describe clamping of a signal to the ground potential using, for example, a one way switch, such as a diode which may shunt to ground with a voltage drop across the diode.

When used in relation to electronic boards in a multi-board system, the expression "substantially similar functionality" and similar expressions refer to boards that can substitute for each other within the system. Typically, one such board is the primary board, while another board or other boards are spare stand-by boards that can take over if, for example, the primary board fails or is taken off-line for another reason, such as updating of the board's firmware.

Other and further definitions (both explicit and implicit) and clarifications of definitions may be found throughout this document. All the definitions are intended to assist in understanding this disclosure and the appended claims, but the broad scope and spirit of the invention should not be construed as strictly limited to the definitions, or to the particular examples described in this specification.

Reference will now be made in detail to several embodiments of the invention that are illustrated in the accompanying drawings. Same reference numerals may be used in the drawings and the description to refer to the same components or steps. The drawings are in simplified form and not to precise scale. For purposes of convenience and clarity only, directional terms, such as top, bottom, left, right, up, down, over, above, below, beneath, rear, and front may be used with respect to the accompanying drawings. These and similar directional terms should not be construed to limit the scope of the invention.

Figure 2:
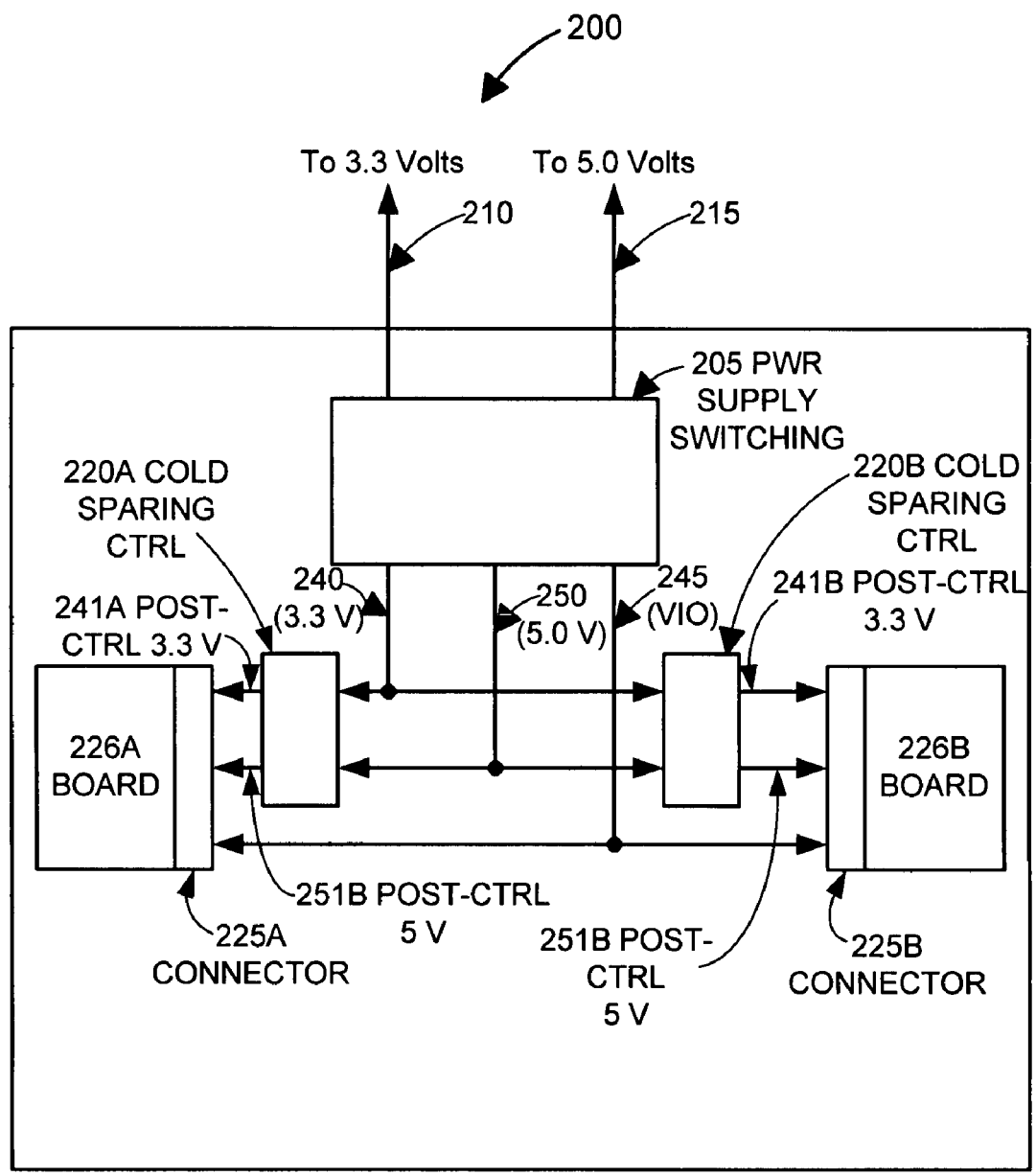
FIG. 2 is a high-level block diagram showing selected components of a backplane in which VIO power connections to sockets for insertable boards are separated from selected other power line connections.

Referring more particularly to the drawings, FIG. 2 illustrates, in a high-level, block-diagram manner, a backplane 200 in which VIO power connections to sockets for insertable cold sparing boards are separated from other power line connections.

The backplane 200 includes a power supply switching assembly 205. In the illustrated embodiment, the power supply switching assembly receives 3.3 Volt electrical power through a power supply connecting line 210, and 5.0 Volt electrical power through a power supply connecting line 215. It should be noted that in some variants the power supply switching assembly 205 receives electrical power at a single potential difference level; in other variants, the power supply switching assembly 205 receives electrical power at three or more potential difference levels. Moreover, the electrical power received by the power supply switching assembly 205 may have voltages other than those shown in FIG. 2. It is also possible for some of the voltages to be alternating (AC) rather than direct (DC).

The power supply switching assembly 205 selectively provides electrical power to all or some components of the backplane 200 on power supply buses 240, 245, and 250. A power supply bus is wiring, printed circuit board traces, or similar components used to distribute operating power on the backplane 200. As illustrated in more detail in FIG. 3, the power supply bus 240 carries 3.3 Volt power; the power supply bus 250 carries 5.0 Volt power; and the power supply bus 245 carries VIO for powering PCI I/O buffers of various boards insertable into connectors 225A and 225B of the backplane 200, such as a board 226A inserted into the connector 225A, and a board 226B inserted into the connector 225B. The boards 226A and 226B may be identical or substantially identical (i.e., configured to provide the same functionality), with one of these boards being a primary (currently functioning) board, and the other being a cold spare board. Note that several primary and/or spare boards of the same kind may be present in the same system and on the same backplane.

Figure 3:
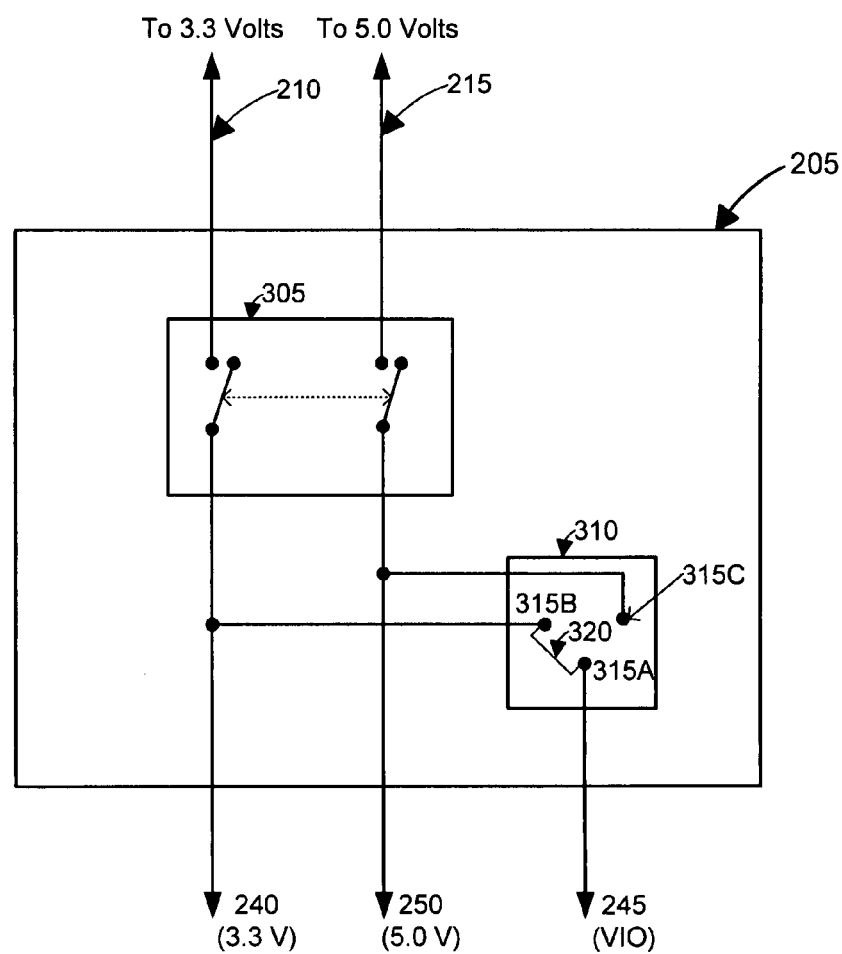
FIG. 3 is a high-level block diagram showing selected components of a power supply switching assembly of the backplane of FIG. 2.

The power supply buses 240 and 250 are coupled, respectively, to power supply connecting lines 210 and 215 through a double-pole, double-throw switch 305. In certain alternative embodiments, other switching configurations may be used, for example, a pair of single-pole, single-throw switches. As shown in FIG. 3, the switch 305 connects and disconnects the power supply buses 240 and 250 to and from their respective power supply lines 210 and 215 in a substantially simultaneous manner. In certain alternative embodiments, the two buses can be connected to their power supply lines independently, or in a predetermined sequence. For example, one of the buses can be connected to its associated power supply line after a preset or a random delay following connection of the other bus to the power supply line associated with the other bus.

A jumper assembly 310 allows selection of the VIO voltage for the power supply bus 245 from the voltages received by the power supply switching assembly 205 on the power supply lines 210 and 215. As shown in FIG. 3, a jumper 320 is connected across terminals 315A and 315B of the jumper assembly 310. In this configuration, the VIO voltage appearing on the power supply bus 245 is the same as the voltage of the power supply bus 240, for example, 3.3 Volts. As a person skilled in the art would understand after perusal of this document and the associated Figures, the jumper 320 may instead connect the terminal 315A to a terminal 315C. In this case, the VIO voltage appearing on the power supply bus 245 would be the same as the voltage of the power supply bus 250, for example, 5.0 Volts. It should be noted that generation of the VIO voltage for the power supply bus 245 may also be performed using regulators, down converters, additional switches, additional jumper assemblies, and similar electrical and electronic devices.

The VIO voltage may also be provided to the power supply bus 245 from a source other than the power supply lines 210 and 215.

Returning now to FIG. 2, the three power supply buses 240, 245, and 250 are distributed to the connectors 225A and 225B. There can also be additional connectors on the backplane 200, including other connectors connected in parallel with the connectors 225A and 225B, and configured for receiving board(s) with the same functionality as the boards 226A and 226B. The connectors 225A/B may provide PCI bus connectivity to the boards plugged into them. It should be noted that some of the connectors may receive only selected (fewer than all) power supply voltages through the associated power supply buses.

Figure 4:
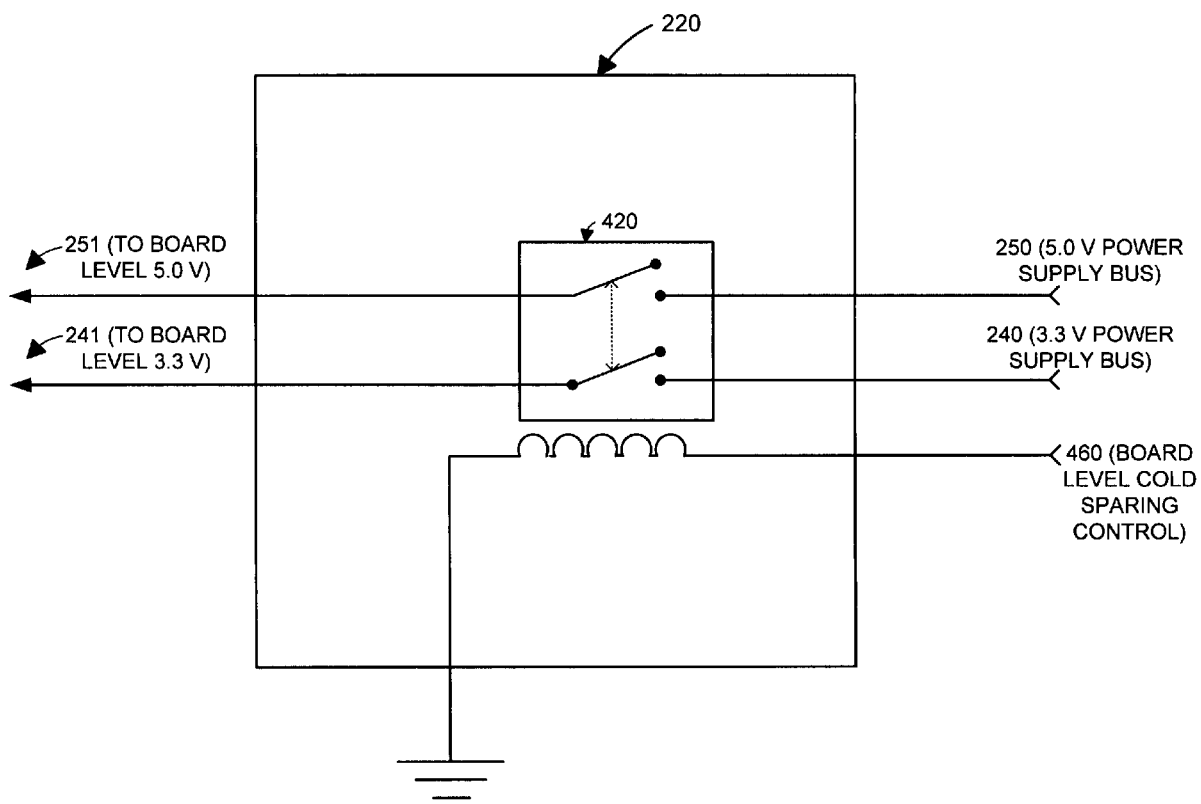
FIG. 4 is a high-level block diagram showing selected components of a cold sparing controller.

Note that the power supply buses 240 and 250 are coupled to the connectors 225A and 225B indirectly, through respective cold sparing controllers 220A and 220B. A representative embodiment of a cold sparing controller 220 (e.g., the cold sparing controller 220A, 220B, or another cold sparing controller) is shown in FIG. 4. In this embodiment, the cold sparing controller 220 includes a relay 420 that selectively connects the power supply buses 240 and 250 to the pins that bring the voltages on these buses to the pins of the connectors 225 that correspond to these voltages. The state of the relay 420 is controlled by the signal on a board level cold sparing control input 460. As shown in FIG. 4, when the input 460 is driven with a high voltage level (logic 1, for example), the power supply buses 240 and 250 are connected to pins 241 and 251; when the input 460 is pulled to a low voltage level (logic 0, for example), the power supply buses 240 and 250 are disconnected from the pins 241 and 251. The relationship between the state of the relay 420 and the voltage level or logic state of the signal on the input 460 may be reversed.

The relay 420 may be implemented as a solid state switch or switches with conducting states and non-conducting states.

In alternative embodiments, the cold sparing control input 460 may receive serial control signals, instead of a control signal with a single voltage level. For example, a first serial command may direct the cold sparing controller 220 to connect the power supply buses 240 and 250 to pins 241 and 251; a second serial command may direct the controller 220 to disconnect the buses 240 and 250 from the pins 241 and 251. The cold sparing control input 460 may also be replaced with two or more lines configured to receive, for example, parallel bus-type signals. A first such parallel control signal may direct the cold sparing controller 220 to connect the power supply buses 240 and 250 to the pins 241 and 251, while a second such parallel command may direct the controller 220 to disconnect the buses 240 and 250 from the pins 241 and 251.

The pins 241 and 251 are coupled to the connector (e.g., 225A/B) that accepts an insertable board (e.g., 226A/B). The state of the controller 220 thus determines whether its associated board receives the 3.3 Volt and 5.0 Volt power from the power supply buses 240 and 250. As shown in FIG. 4, the state of the cold sparing controller 220 need not affect the supply of VIO power to the associated board.

In some embodiments, the relay 420 may be a normally-closed relay, so that the power supply buses 240 and 250 are connected to the corresponding pins of the connector 225 unless the input 460 is driven with a signal at a predetermined voltage level, for example, a high voltage level. Conversely, the relay 420 may be a normally-open relay, so that the power supply buses 240 and 250 are disconnected from the corresponding pins of the connector 225 unless the input 460 is driven with a signal at a predetermined voltage level, for example, a high voltage level.

Moreover, one or several cold sparing controllers 220 used on the same backplane 200 may have normally open relay(s), while one or more other cold sparing controllers 220 may have normally closed relay(s), with the same signal controlling the state of the relay on both sets of the cold sparing controllers 220.

In one variant of the embodiment 200 of FIG. 2, the states of the cold sparing controllers 220A and 220B are determined by the same cold sparing signal, but their respective states are inverted. For example, the controller 220A connects the power supply buses 240 and 250 to the connector 225A and the board 226A, while the controller 220B isolates the power supply buses 240 and 250 from the connector 225B and the board 226B. When the level of the cold sparing control signal changes, the controller 220A disconnects and isolates the power supply buses 240 and 250 from the connector 225A and the board 226A, and the controller 220B connects the buses 240 and 250 to the connector 225B and the board 226B. One of the boards in the connectors 225 is thus a primary board, while the other board is a spare board.

Figure 5:
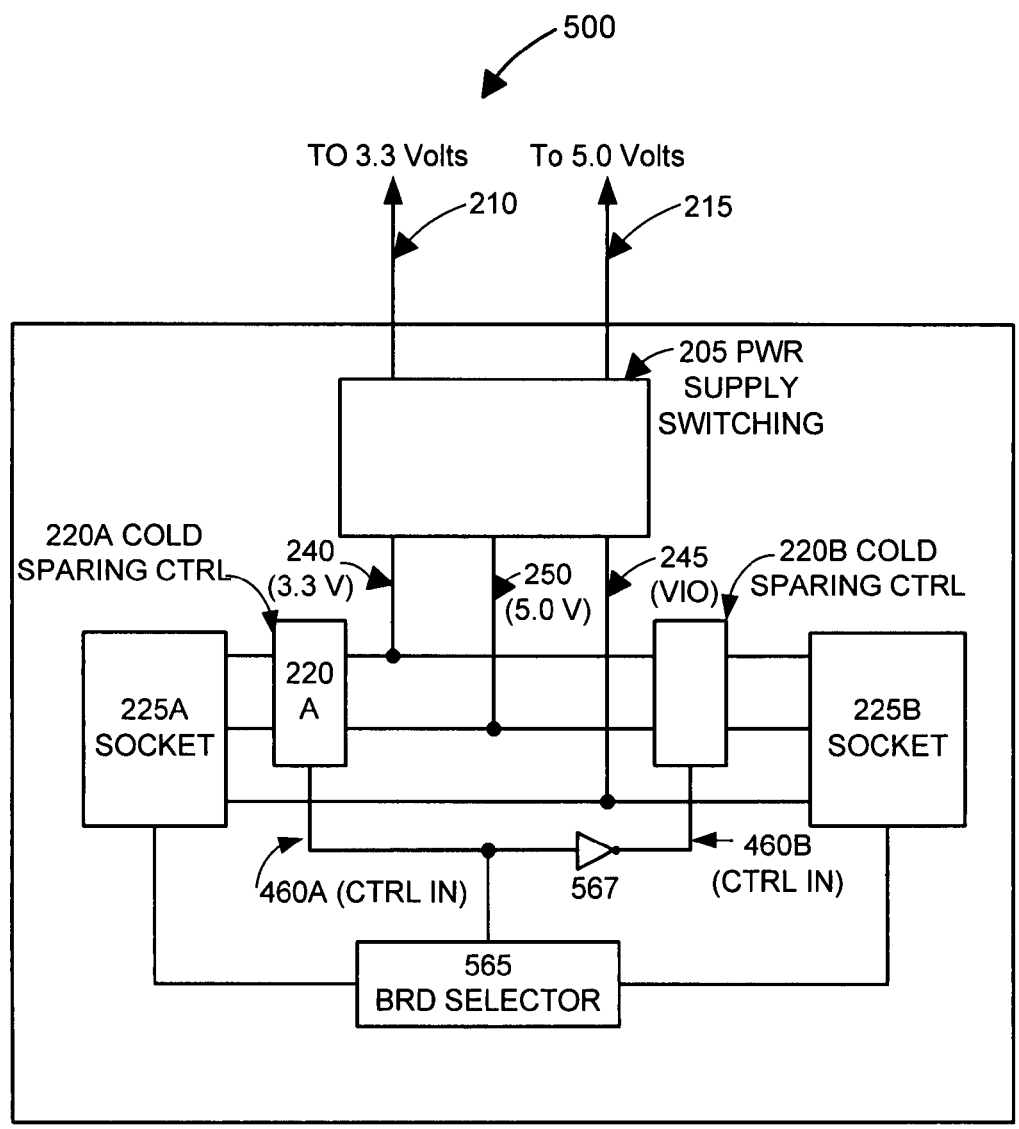
FIG. 5 is a high-level block diagram showing selected components of another backplane in which VIO power connections to sockets for insertable boards are separated from selected other power line connections.

The controllers 220A and 220B may be identical in this variant, with the state inversion being achieved through inversion of one of the cold sparing control signals. This is illustrated in FIG. 5, which is similar to the FIG. 2, but also shows a board selector 565 that drives the cold sparing control input 460A of the controller 220A directly, and the cold sparing control input 460B of the controller 220B through an inverter 567. The board selector 565 thus selects which of the boards in the connectors 225 is the primary (currently functioning) board, and which is the cold spare board. The selection may be based on the signals received by the board selector 565 from the connectors 225A and 225B. For example, the board selector 565 may select the board in the connector 225A as the primary board at power up. If a fault is later detected in the primary board, the board selector then may change the selection so that the spare board in the connector 525B becomes the primary board. A fault may result, for example, from a failure of the board to reset a watchdog timer, or from a failure to send a predetermined signal to the board selector 565.

The VIO power supply bus 245 is coupled to the connectors 225A and 225B directly, i.e., not through the relays of one of the respective cold sparing controllers 220A and 220B. The voltage on the VIO power supply bus 245 is therefore applied to both boards 226A and 226B regardless of the state of the signals on the input 460A of the cold sparing controller 220A and the input 460B of the cold sparing controller 220B. The VIO power is thus available to each of the boards 226A and 226B, regardless of which of these boards is the primary board and which is the cold spare board. Additionally, the design of these boards is such that the VIO power from the connectors 225 is used for the PCI interface. The PCI interface is therefore powered on on each of the boards, including the cold spare boards whose other components are powered off.

Because the VIO voltage is applied to the cold spare board, clamping diodes used on that board's PCI bus will not short the PCI bus to ground, as is the case with prior art designs. Referring once again to FIG. 1, the clamping diode 115 is no longer substantially a short to the ground, because its cathode is at a positive potential of the VIO power supply. At the same time, the total power consumption and concomitant heat generation are reduced on the board 226 that is disconnected from the 3.3 Volt and 5.0 Volt power (e.g., the board 226B) almost to the same extent as on a cold spare board in a conventional system in which no power is provided to the cold spare board. As compared to a "hot" spare board (i.e., a spare board to which all power continues to be provided), the total reduction in power consumption may reach ninety percent or more. In some embodiments, the total reduction in power consumption may exceed ninety-nine percent. In some embodiments, only the PCI interface receives the VIO, with all components of the cold spare board other than the PCI interface not being powered.

The board selector 565 may be implemented as one or more boards pluggable into the backplane 200, a module or modules of components on the backplane 200, as modules of components on the boards 226A and 226B, or elsewhere in the system. Functionality of the board selector 565 may also be distributed throughout the system.

Similarly, the cold sparing controllers 220A and 220B may be implemented as one or more boards pluggable into the backplane 200, a module or modules of components on the backplane 200, or as modules of components on the boards 226A and 226B. The functionality of the cold sparing controllers 220A and 220B may also be distributed throughout the system.

Figure 6:
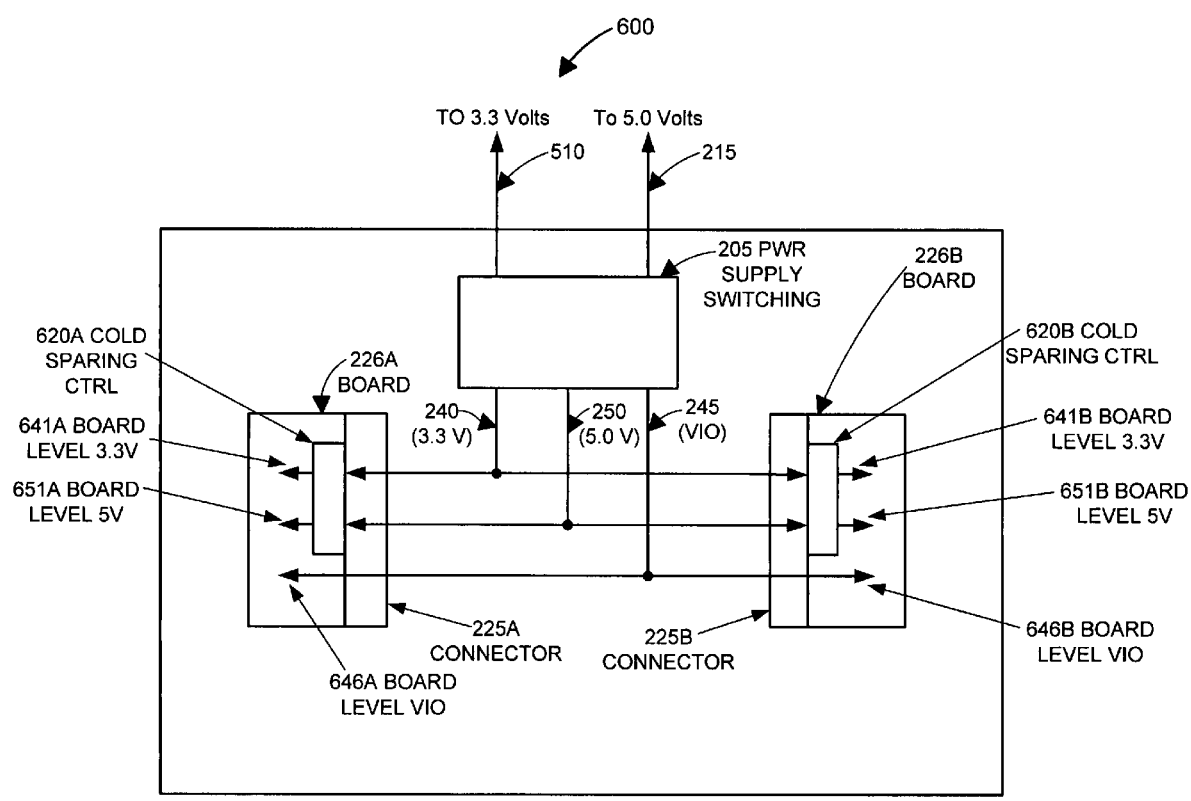
FIG. 6 is a high-level block diagram showing selected components of a backplane in which VIO power connections are separated from selected other power line connections.

FIG. 6 illustrates an embodiment in which cold sparing controllers 620A and 620B are built into the respective primary and cold spare boards 226A and 226B inserted into the connectors 225A and 225B. Each of the cold sparing controllers 620A/B may have the same structure and functionality as shown in FIG. 4. Here, the three power supply buses 240, 245, and 250 are brought to each of the connectors 225A/B, and are routed to the boards 226A/B. The controllers 620A/B and a board selector determine which of the boards 226 is powered on, and which is a cold spare board.

The cold sparing controller 620A controls the supply of 3.3V and 5.0V power to the board 226A by selectively connecting the power supply bus 240 to a connection 641A, which distributes the 3.3V power on the board 226A, and selectively connecting the power supply bus 250 to a connection 651A, which distributes the 5.0V power on the board 226A. Similarly, the cold sparing controller 620B controls the supply of 3.3V and 5.0V power to the board 226B by selectively connecting the power supply bus 240 to a connection 641B, which distributes the 3.3V power on the board 226B, and selectively connecting the power supply bus 250 to a connection 651B, which distributes the 5.0V power on the board 226B.

Unlike the 3.3V and 5.0V buses, the VIO power supply bus is connected directly (i.e., not through a cold sparing controller) to the PCI interfaces on each of the boards 226A and 226B. Thus, the VIO voltage is available to the PCI interfaces on both the primary board (e.g, 226A), and the cold spare board (e.g., 226B). As in the embodiment shown in FIG. 2, the availability of the VIO power on the cold spare board (e.g., 226B) prevents the PCI signal lines from being substantially shorted to ground on that board. In comparison to a "hot" spare board of the same type, the total reduction in power consumption may reach ninety percent or more. In some embodiments, the total reduction in power consumption may exceed ninety-nine percent. In some embodiments, only the PCI interface receives the VIO, with all components of the cold spare board other than the PCI interface not being powered.

In the embodiments described above, a cold sparing controller selectively controls connection to its associated board of all operating voltages (other than the VIO power). It should be understood, however, that in other embodiments a cold sparing controller may selectively control connection to its associated board of fewer than all operating voltages (other than the VIO power). In such embodiments, connection of the VIO power and at least one operating voltage to a board are not controlled by the board's associated cold sparing controller.

It should be understood that the various computer system elements and process steps described throughout this document can be realized in hardware, firmware, software, or a combination of some or all of the above. It should also be understood that the various method steps performed by one or more processors of the computer systems may be stored in a machine-readable medium, such as a CD, DVD, flash memory, floppy or hard drive, or a similar storage device.

The inventive apparatus and methods for providing PCI-compatible computer buses and backplanes with cold sparing capability have been described above in considerable detail. This was done for illustration purposes. Neither the specific embodiments of the invention as a whole, nor those of its features, limit the general principles underlying the invention. In particular, the invention is not necessarily limited to the specific buses mentioned or to the buses in accordance with current PCI specifications. The features described herein may be used in some embodiments, but not in others, without departure from the spirit and scope of the invention as set forth. Many additional modifications are intended in the foregoing disclosure, and it will be appreciated by those of ordinary skill in the art that, in some instances, some features of the invention will be employed in the absence of a corresponding use of other features. The illustrative examples therefore do not necessarily define the metes and bounds of the invention and the legal protection afforded the invention, which function is served by the claims and their equivalents.

I claim:

1. A method of providing power to a first board of a multi-board digital system, the method comprising:
    preventing at least one first operating voltage for powering the first board from reaching the first board to cause the first board to be in a spare board state; and
    providing I/O voltage (VIO) power to a communication interface of the first board so that one or more clamping diodes between one or more lines of the communication interface and a rail that provides the VIO power to the communication interface of the first board do not clamp the one or more lines substantially to ground potential when the first board is in the spare board state.

2. The method according to claim 1, wherein the communication interface is a PCI (peripheral component interconnect) bus or a cPCI (compact PCI) bus.

3. The method according to claim 2, further comprising:
    preventing at least one second operating voltage for powering the first board from reaching the first board when the first board is in the spare board state.

4. The method according to claim 2, further comprising:
    monitoring a second board of the multi-board digital system to detect a failure in the second board; and
    terminating the step of preventing at least one first operating voltage in response to detection of the failure in the second board, so that the first board is powered by the VIO voltage and the first operating voltage following the failure.

5. The method according to claim 4, wherein the second board is configured to perform substantially the same functions as the first board.

6. The method according to claim 4, wherein the step of monitoring comprises sensing to determine an expiration of a watchdog timer.

7. The method according to claim 4, wherein the step of monitoring comprises using a board selector module located on a backplane of the multi-board digital system.

8. The method according to claim 4, wherein:
    the step of preventing at least one first operating voltage comprises maintaining a solid state switch in a non-conducting state; and
    the step of terminating comprises changing state of the solid state switch to a conducting state.

9. The method according to claim 4, wherein:
    the step of preventing at least one first operating voltage comprises maintaining a normally-open relay in an open state; and
    the step of terminating comprises changing state of the normally-open relay to a closed state.

10. The method according to claim 4, wherein:
    the step of preventing at least one first operating voltage comprises maintaining a normally-closed relay in an open state; and
    the step of terminating comprises changing state of the normally-closed relay to a closed state.

11. The method according to claim 4, wherein:
    the step of preventing at least one first operating voltage comprises maintaining a first switch located on a backplane of the multi-board digital system in a first state;
    the step of terminating comprises changing state of the first switch to a second state;
    the first board is inserted into a first connector of the backplane; and
    the second board is inserted into a second connector of the backplane.

12. The method according to claim 11, further comprising:
    preventing the at least one first operating voltage from reaching the second board in response to detection of the failure in the second board.

13. The method according to claim 12, wherein the step of preventing the at least one first operating voltage from reaching the second board comprises changing state of a second switch located on the backplane.

14. The method according to claim 4, wherein:
    the step of preventing at least one first operating voltage comprises maintaining a first switch located on the first board in an open state; and
    the step of terminating comprises changing state of the first switch to a closed state.

15. The method according to claim 14, further comprising:
    in response to detection of the failure in the second board, changing state of a second switch located on the second board to prevent the at least one first operating voltage from reaching components of the second board.

16. A multi-board digital system, comprising:
    one or more lines of an inter-board communication bus;
    a first board and a second board, the first board being configured to perform substantially same functions as the second board, the first board comprising a first inter-board communication interface to the one or more lines of the inter-board communication bus, the first communication interface comprising a first voltage I/O (VIO) rail;

a first cold sparing controller configured to
(1) provide to the first board at least one operating voltage in a first state, and
(2) isolate the first board from the at least one operating voltage in a second state; and a VIO power bus configured to provide an I/O voltage (VIO) power to the first VIO rail when the first cold sparing controller is in the first state and also when the first cold sparing controller is in the second state.

17. The system according to claim 16, wherein the first inter-board communication interface further comprises first one or more clamping diodes disposed between the one or more lines and the first VIO rail so as to protect the first inter-board communication interface from voltage overshoot on the one or more lines, whereby the VIO power bus prevents the first one or more clamping diodes from clamping the one or more lines to substantially ground potential when the first cold sparing controller is in the second state.

18. The system according to claim 17, wherein the inter-board communication interface is configured to operate under a PCI (peripheral component interconnect) bus or a cPCI (compact PCI) bus standard.

19. The system according to claim 18, further comprising a board selector configured to monitor the second board and to cause the first cold sparing controller to switch from the second state to the first state in response to detecting a fault in the second board.

20. The system according to claim 19, wherein the second board comprises a second inter-board communication interface to the one or more lines of the inter-board communication bus, the second communication interface comprising a second VIO rail and second one or more clamping diodes disposed between the one or more lines and the second VIO rail so as to protect the second communication interface from voltage overshoot on the one or more lines, the system further comprising a second cold sparing controller configured to
(1) provide to the second board the at least one operating voltage in the first state, and
(2) isolate the second board from the at least one operating voltage in the second state.

21. The system according to claim 20, wherein the board selector is further configured to cause the second cold sparing controller to switch from the first state to the second state in response to detecting a fault in the second board.

22. The system according to claim 21, wherein:
the first cold sparing controller is disposed on the first board; and
the second cold sparing controller is disposed on the second board.

23. The system according to claim 21, further comprising:
a backplane,
the backplane comprising a first electrical connector and a second electrical connector;
wherein: the one or more lines of the inter-board communication bus are disposed on the backplane and couple the one or more lines to the first and second electrical connectors;
the first board is inserted into the first electrical connector; and the second board is inserted into the second electrical connector.

24. The system according to claim 21, wherein the first cold sparing controller comprises a solid state switch.

25. The system according to claim 21, wherein the first cold sparing controller comprises a normally-open relay.

26. The system according to claim 21, wherein the first cold sparing controller comprises a normally-closed relay.

27. The system according to claim 21, wherein the board selector is further configured to monitor the first board and to cause the first cold sparing controller to switch from the first state to the second state in response to detecting a fault in the first board.

28. The system according to claim 21, wherein the at least one operating voltage comprises a first operating voltage and a second operating voltage.

29. The system according to claim 21, wherein the at least one operating voltage comprises all operating voltages of the first board other than voltage of the VIO power bus.

30. A method of providing power to a first board of a multi-board digital system, the method comprising:
preventing at least one first operating voltage for powering the first board from reaching the first board to cause the first board to be in a spare board state; and
providing I/O voltage (VIO) power to a communication interface of the first board so that one or more clamping diodes between one or more lines of the communication interface and a rail that provides the VIO power to the communication interface of the first board do not clamp the one or more lines substantially to ground potential when the first board is in the spare board state;
wherein the communication interface is a PCI (peripheral component interconnect) bus or a cPCI (compact PCI) bus;
the method further comprising:
monitoring a second board of the multi-board digital system to detect a failure in the second board; and
terminating the step of preventing at least one first operating voltage in response to detection of the failure in the second board, so that the first board is powered by the VIO voltage and the first operating voltage following the failure;
wherein the step of preventing at least one first operating voltage comprises maintaining a first switch located on the first board in an open state; and
the step of terminating comprises changing state of the first switch to a closed state.

31. The method according to claim 30, further comprising:
in response to detection of the failure in the second board, changing state of a second switch located on the second board to prevent the at least one first operating voltage from reaching components of the second board.

32. The method of providing power to a first board of a multi-board digital system, the method comprising:
preventing at least one first operating voltage for powering the first board from reaching the first board to cause the first board to be in a spare board state; and
providing I/O voltage (VIO) power to a communication interface of the first board so that one or more clamping diodes between one or more lines of the communication interface and a rail that provides the VIO power to the communication interface of the first board do not clamp the one or more lines substantially to ground potential when the first board is in the spare board state;
the method further comprising:
monitoring a second board of the multi-board digital system to detect a failure in the second board; and
terminating the step of preventing at least one first operating voltage in response to detection of the failure in the second board, so that the first board is powered by the VIO voltage and the first operating voltage following the failure;

wherein the step of preventing at least one first operating voltage comprises maintaining a first switch located on the first board in an open state; and the step of terminating comprises changing state of the first switch to a closed state.

33. The method according to claim 32, further comprising:

in response to detection of the failure in the second board, changing state of a second switch located on the second board to prevent the at least one first operating voltage from reaching components of the second board.

34. A multi-board digital system, comprising:

one or more lines of an inter-board communication bus;

a first board and a second board, the first board being configured to perform substantially same functions as the second board, the first board comprising a first inter-board communication interface to the one or more lines of the inter-board communication bus, the first communication interface comprising a first voltage I/O (VIO) rail;

a first cold sparing controller configured to
(1) provide to the first board at least one operating voltage in a first state, and
(2) isolate the first board from the at least one operating voltage in a second state; and a VIO power bus configured to provide an I/O voltage (VIO) power to the first VIO rail when the first cold sparing controller is in the first state and when the first cold sparing controller is in the second state;

wherein the first inter-board communication interface further comprises first one or more clamping diodes disposed between the one or more lines and the first VIO rail so as to protect the first inter-board communication interface from voltage overshoot on the one or more lines, whereby the VIO power bus prevents the first one or more clamping diodes from clamping the one or more lines to substantially ground potential when the first cold sparing controller is in the second state;

wherein the inter-board communication interface is configured to operate under a PCI (peripheral component interconnect) bus or a cPCI (compact PCI) bus standard;

the system further comprising a board selector configured to monitor the second board and to cause the first cold sparing controller to switch from the second state to the first state in response to detecting a fault in the second board;

wherein the second board comprises a second inter-board communication interface to the one or more lines of the inter-board communication bus, the second communication interface comprising a second VIO rail and second one or more clamping diodes disposed between the one or more lines and the second VIO rail so as to protect the second communication interface from voltage overshoot on the one or more lines, the system further comprising a second cold sparing controller configured to
(1) provide to the second board the at least one operating voltage in the first state, and
(2) isolate the second board from the at least one operating voltage in the second state;

wherein the board selector is further configured to cause the second cold sparing controller to switch from the first state to the second state in response to detecting a fault in the second board;

wherein:

the first cold sparing controller is disposed on the first board; and the second cold sparing controller is disposed on the second board.

* * * * *

UNITED STATES PATENT AND TRADEMARK OFFICE
CERTIFICATE OF CORRECTION

PATENT NO.        : 7,673,186 B2                                    Page 1 of 1
APPLICATION NO.   : 11/449510
DATED             : March 2, 2010
INVENTOR(S)       : Hillman It is certified that error appears in the above-identified patent and that said Letters Patent is hereby corrected as shown below:

Title page, item (74) Attorney, Agent or Firm, delete "Oppendahl" and insert --Oppedahl--

Signed and Sealed this

Twenty-second Day of June, 2010

David J. Kappos
*Director of the United States Patent and Trademark Office*